United States Patent
Saito et al.

(10) Patent No.: US 9,450,129 B2
(45) Date of Patent: Sep. 20, 2016

(54) MULTILAYER SHEET, BACK SHEET FOR SOLAR CELLS AND SOLAR CELL MODULE

(71) Applicant: DENKI KAGAKU KOGYO KABUSHIKI KAISHA, Tokyo (JP)

(72) Inventors: Tomoo Saito, Isesaki (JP); Toru Arai, Machida (JP)

(73) Assignee: Denka Company Limited, Tokyo (JP)

( * ) Notice: Subject to any disclaimer, the term of this patent is extended or adjusted under 35 U.S.C. 154(b) by 263 days.

(21) Appl. No.: 14/373,017

(22) PCT Filed: Jan. 17, 2013

(86) PCT No.: PCT/JP2013/050756
§ 371 (c)(1),
(2) Date: Jul. 17, 2014

(87) PCT Pub. No.: WO2013/108816
PCT Pub. Date: Jul. 25, 2013

(65) Prior Publication Data
US 2014/0373915 A1 Dec. 25, 2014

(30) Foreign Application Priority Data
Jan. 17, 2012 (JP) .................................. 2012-007166

(51) Int. Cl.
| | | |
|---|---|---|
| B32B 27/00 | (2006.01) | |
| H01L 31/048 | (2014.01) | |
| B32B 27/32 | (2006.01) | |
| B32B 7/12 | (2006.01) | |
| B32B 27/08 | (2006.01) | |
| B32B 27/30 | (2006.01) | |
| H01L 31/042 | (2014.01) | |
| H01L 31/049 | (2014.01) | |

(52) U.S. Cl.
CPC ............ H01L 31/0487 (2013.01); B32B 7/12 (2013.01); B32B 27/08 (2013.01); B32B 27/304 (2013.01); B32B 27/32 (2013.01); H01L 31/049 (2014.12); H01L 31/0481 (2013.01); H02S 20/00 (2013.01); *B32B 2307/306* (2013.01); *B32B 2307/712* (2013.01); *B32B 2307/7265* (2013.01); *B32B 2457/12* (2013.01); *Y02E 10/50* (2013.01)

(58) Field of Classification Search
CPC ....... B32B 27/30; B32B 27/32; B23B 27/00; H01L 31/042
USPC ......... 136/256; 428/516, 523, 517, 519, 521
See application file for complete search history.

(56) References Cited

U.S. PATENT DOCUMENTS

| 6,407,329 B1 | 6/2002 | Iino et al. ..................... 136/251 |
|---|---|---|
| 2001/0051256 A1 | 12/2001 | Silagy et al. ................. 428/212 |
| 2010/0071756 A1* | 3/2010 | Krajewski ............... B32B 15/08 |
| | | 136/251 |
| 2011/0048512 A1 | 3/2011 | Chu et al. ..................... 136/252 |
| 2013/0209795 A1* | 8/2013 | Liu ........................ B32B 27/08 |
| | | 428/337 |
| 2015/0200319 A1* | 7/2015 | Miyamura ............ B32B 27/304 |
| | | 136/259 |

FOREIGN PATENT DOCUMENTS

| EP | 1 182 710 A1 | 2/2002 | |
|---|---|---|---|
| JP | 1-314166 A | 12/1989 | |
| JP | 2-72945 A | 3/1990 | |
| JP | 11-261085 A | 9/1999 | |
| JP | 2000-294813 A | 10/2000 | |
| JP | 2003-168814 A | 6/2003 | |
| JP | 2009/246360 A | 10/2009 | |
| JP | 2011-176193 A | 9/2011 | |
| JP | 2012-59732 A | 3/2012 | |
| JP | 2012-81732 A | 4/2012 | |
| JP | 2013108816 A * | 6/2013 | |
| WO | WO 00/62348 A1 | 10/2000 | |
| WO | WO 2009/113318 A1 | 9/2009 | |
| WO | WO 2011/028672 A1 | 3/2011 | |
| WO | WO 2011028672 A1 * | 3/2011 | ............... B32B 7/12 |

OTHER PUBLICATIONS

Extended European Search Report mailed Aug. 24, 2015, issued to European Application No. 13738176.0.
International search Report mailed Apr. 23, 2013, issued to corresponding International Application No. PCT/JP2013/050756.

* cited by examiner

*Primary Examiner* — Douglas McGinty
(74) *Attorney, Agent, or Firm* — Stein IP, LLC

(57) ABSTRACT

Provided are a multilayer sheet superior in weather resistance, heat resistance, and moisture proofness and also favorable in interlayer adhesiveness, and a back sheet for solar cells and a solar cell module prepared by using the same. The multilayer sheet 10 is prepared by laminating a polyolefin-based resin layer 1 having a melt flow rate, as determined by the method A specified in JIS K7210, of 0.5 to 25 g/10 minutes at 230° C. under a load of 2.16 kg and a polyvinylidene fluoride-based resin layer 2 having a melt flow rate, as determined by the method A specified in JIS K7210, of 0.5 to 25 g/10 minutes at 230° C. under a load of 2.16 kg, via an adhesion resin layer 3 of a conjugated diene-based polymer, a conjugated diene-based copolymer, or the hydride thereof having a melt flow rate, as determined by the method A specified in JIS K7210, of 0.1 to 50 g/10 minutes at 230° C. under a load of 2.16 kg. A back sheet prepared by using the multilayer sheet 10 is layered on a sealing material of a solar cell, to give a solar cell module.

13 Claims, 1 Drawing Sheet

MULTILAYER SHEET, BACK SHEET FOR SOLAR CELLS AND SOLAR CELL MODULE

CROSS-REFERENCE TO RELATED APPLICATIONS

This application is a national stage of International Application No. PCT/JP2013/050756, filed Jan. 17, 2013, which claims the benefit of Japanese Application No. 2012-007166, filed Jan. 17, 2012 in the Japanese Patent Office. All disclosures of the documents named above are incorporated herein by reference.

BACKGROUND OF THE INVENTION

1. Field of the Invention

The present invention relates to a multilayer sheet and also a back sheet for solar cells and a solar cell module prepared by using the multilayer sheet. More specifically, it relates to a multilayer sheet having a polyvinylidene fluoride-based resin layer and also a back sheet for solar cells and a solar cell module prepared by using the same.

2. Description of the Related Art

As solar cell modules are used outdoors for an extended period of time, for assurance of mechanical strength and prevention of degradation under the environment atmosphere, generally, they have a configuration in which the solar cells are sealed with a synthetic resin, covered with a transparent strengthened glass on the sunlight-exposed face and protected with a back sheet on the opposite face. The back sheet for solar cells used then is for example a laminate of an aluminum foil and a resin film or a laminate of multiple resin films different in composition (see, for example, Patent Documents 1 to 5).

For improvement of weather resistance, Patent Document 1 proposes a rear face-protection sheet for solar cells in the configuration of a laminate of polyethylene-based resins each having a particular density or a laminate of a polyethylene-based resin having a particular density and a thermoplastic polyester resin film. Alternatively, Patent Document 2 proposes an integrated back sheet having an external surface film and a moisture-proof film adhered with an adhesive based on an ethylene-vinyl acetate copolymer. The back sheet described in Patent Document 2 employs a laminate film consisting of a base film and an inorganic oxide coating film formed on the surface thereof as its moisture-proof film and a fluoroplastic film as the external surface film.

Alternatively in the rear face-protection sheet for solar cell modules described in Patent Document 3, a heat-resistant polypropylene-based resin film containing a colorant additive, an ultraviolet absorbent, and a photostabilizer is laminated on both faces of a base film having a vapor-deposited film of an inorganic oxide. Alternatively in the rear face-protection sheet for solar cell modules described in Patent Document 4, a fluoroplastic layer having a halogen mass ratio of 50% or more is laminated on one or both faces of a polyphenylene ether base sheet for improvement of flame resistance.

Generally in such a multilayered back sheet for solar cells, multiple films are laminated with an adhesive. Alternatively, Patent Document 5 proposes use of a hydrolysis-resistant, electrically insulating, and water-blocking acrylic adhesive in lamination of a polyester base material, a polycarbonate-based base material, a fluorine-based base material, or an acrylic-based base material.

CITATION LIST

Patent Literatures

[Patent Document 1] JP-A No. H11-261085
[Patent Document 2] JP-A No. 2000-294813
[Patent Document 3] JP-A No. 2003-168814
[Patent Document 4] JP-A No. 2011-176193
[Patent Document 5] JP-A No. 2009-246360

SUMMARY OF THE INVENTION

Technical Problem

Although the conventional multilayer sheets described above satisfy the requirements in weather resistance, heat resistance, moisture proofness, and other various properties demanded for the back sheets for solar cells and the solar cell modules using the same, further improvement is desired. In particular, as fluorine-based resins and polyolefin-based resins are less adhesive to other resins, multilayer sheets prepared by using these resins have a problem that the interlayer adhesiveness is not sufficiently high.

Accordingly, the main object of the present invention is to provide a multilayer sheet superior in weather resistance, heat resistance, and moisture proofness and also favorable in interlayer adhesiveness, and a back sheet for solar cells and a solar cell module prepared by using the same.

Solution to Problem

After intensive studies to solve the problems above, the inventors have obtained the following findings: First, the inventors have found that it is possible to improve the properties required for solar cell back sheets, including weather resistance, heat resistance, moisture proofness, electrical insulating properties, and others, by laminating a layer of a polyolefin-based resin composition with a layer of a polyvinylidene fluoride-based resin composition.

Then, the inventors studied the method of laminating these resin layers. When multiple films are bonded with an adhesive, as in conventional multilayer sheets, its production demands the steps of filming the resins, winding the films, applying an adhesive thereto, drying the coated films, and bonding the films, which increases the processing cost. Possible methods for eliminating these steps include, for example, a coextrusion filming method of melting the resins for respective layers in an extruder and layering and adhering them to each other in the molten state, a method of filming and bonding an adhesive layer and the layers to be bonded to each other simultaneously, and the like.

However, in the methods such as coextrusion filming, it is difficult to preserve favorable adhesive strength between the layers and there is observed fluctuation in thickness of the layers due to difference in fluidity of the respective layers and also to draw resonance, and thus, these methods were not used practically in production of multilayer sheets containing a polyvinylidene fluoride-based resin. In particular in the case when a polyvinylidene fluoride-based resin and a polyolefin-based resin are laminated, integral molding by coextrusion molding or lamination by bonding the respective resin sheets results in insufficient interlayer adhesiveness.

Accordingly, the inventors have studied a method for improving the interlayer adhesiveness between a layer of a polyvinylidene fluoride-based resin composition and a layer of a polyolefin-based resin composition. And, they have found that it is possible to obtain a multilayer sheet superior in interlayer adhesiveness by laminating these layers via an adhesion resin layer of a conjugated diene-based polymer, a conjugated diene-based copolymer, or the hydride thereof and made the present invention.

Specifically, the multilayer sheet according to the present invention is a multilayer sheet, comprising a first resin layer of a polyolefin-based resin composition having a melt flow rate, as determined by the method A specified in JIS K7210, of 0.5 to 25 g/10 minutes at 230° C. under a load of 2.16 kg, a second resin layer of a polyvinylidene fluoride-based resin composition having a melt flow rate, as determined by the method A specified in JIS K7210, of 0.5 to 25 g/10 minutes at 230° C. under a load of 2.16 kg, and an adhesion resin layer of a conjugated diene-based polymer, a conjugated diene-based copolymer, or the hydride thereof having a melt flow rate, as determined by the method A specified in JIS K7210, of 0.1 to 50 g/10 minutes at 230° C. under a load of 2.16 kg, wherein the first and second resin layers are laminated via the adhesion resin layer.

The adhesion resin layer in the multilayer sheet may be made of a homopolymer of a conjugated diene having 4 to 8 carbon atoms, a copolymer of a conjugated diene having 4 to 8 carbon atoms and other monomers, or the hydride thereof.

In this case, the adhesion resin layer above may be made, for example, of a copolymer of a conjugated diene having 4 to 8 carbon atoms and an aromatic vinyl compound or the hydride thereof.

The polyvinylidene fluoride-based resin composition forming the second resin layer may contain 100 parts by mass of resin components (polyvinylidene fluoride: 50 to 99 mass % and polymethyl methacrylate: 1 to 50 mass %) and 1 to 40 parts by mass of a white inorganic pigment.

The first resin layer may have a thickness, for example, of 50 to 500 μm, and the second resin layer and the adhesion resin layer may have a thickness, for example, of 5 to 50 μm.

The polyolefin-based resin composition forming the first resin layer may contain, as its resin component, a homopolymer of an olefinic hydrocarbon having 2 to 20 carbon atoms, or a copolymer of an olefinic hydrocarbon having 2 to 20 carbon atoms and other monomers.

In that case, the resin component of the polyolefin-based resin composition may contain the unit derived from an olefinic hydrocarbon having 2 to 20 carbon atoms described above in an amount of 70 mass % or more.

In addition, the polyolefin-based resin composition forming the first resin layer may contain a flame retardant and/or a weather-resistance improver, as blended.

On the other hand, the multilayer sheet may be prepared, for example, by melt-coextrusion molding in a temperature range of 130 to 260° C. or as the first resin layer, the adhesion resin layer, and the second resin layer separately prepared are layered in that order and laminated under pressure under a temperature condition of 130 to 260° C.

Further, the multilayer sheet may comprise additionally a third resin layer containing an ethylene vinyl acetate copolymer as the resin component at least on one face thereof.

The back sheet for solar cells according to the present invention is prepared by using the multilayer sheet described above.

The solar cell module according to the present invention is prepared by using the back sheet described above.

Advantageous Effects of Invention

It is possible according to the present invention, i.e., by laminating a polyolefin-based resin layer and a polyvinylidene fluoride-based resin layer with an adhesive resin layer of a conjugated diene-based polymer, a conjugated diene-based copolymer, or the hydride thereof, to provide a multilayer sheet superior in weather resistance, heat resistance, and moisture proofness and also favorable in interlayer adhesiveness.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Hereinafter, favorable embodiments of the invention will be described in detail with reference to attached drawings. The present invention is not limited to the embodiments described below.

First Embodiment

Figure 1:
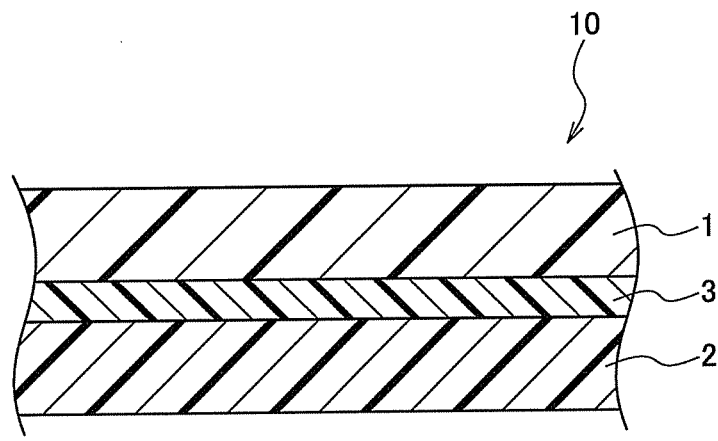
FIG. 1 is a schematic view illustrating the configuration of a multilayer sheet in the first embodiment of the present invention.

First, a multilayer sheet in the first embodiment of the present invention will be described. FIG. 1 is a schematic Figure illustrating the multilayer sheet in the present embodiment. As shown in FIG. 1, in the multilayer sheet 10 of the present embodiment, a polyolefin-based resin layer 1 and a polyvinylidene fluoride-based resin layer 2 are laminated via an adhesion resin layer 3 of a conjugated diene-based polymer, a conjugated diene-based copolymer, or the hydride thereof.

[Polyolefin-Based Resin Layer 1]

The polyolefin-based resin layer 1 is made of a polyolefin-based resin composition containing a polyolefin-based resin as the major component. The polyolefin-based resin composition preferably contains, as its resin component, a homopolymer of an olefinic hydrocarbon having 2 to 20 carbon atoms or a copolymer of an olefinic hydrocarbon having 2 to 20 carbon atoms and other monomers. Such a resin composition gives a multilayer sheet superior in mechanical strength and modulus of elasticity and improved in handleability. In addition, as the resin layer is also improved in thermal durability, it gives a multilayer sheet favorable for example as the back sheet for solar cells.

The polyolefin-based resin as the major component contains the unit derived from olefinic hydrocarbon having 2 to 20 carbon atoms preferably in an amount of 70 mass % or more and more preferably in an amount of 90 mass % or more. In this way, the resin composition gives a multilayer sheet superior in mechanical strength and modulus of elasticity and improved in thermal durability and also in resistance to the heat stress associated with the change from low-temperature environment to high-temperature environment. It is thus possible to obtain a multilayer sheet particularly favorable, for example, as a back sheet for solar cells. Each resin component contained in the polyolefin-based resin composition is preferably a thermoplastic resin.

Examples of the polyolefin-based resins include low-density polyethylene, medium-density polyethylene, high-density polyethylene, straight-chain (linear) low-density polyethylene, polypropylene, propylene-ethylene copolymers, propylene-butene copolymers, polymethylpentene, ethylene-polymethylpentene copolymers, and the like. Cyclic olefin polymers such as polynorbornene, ethylene-norbornene copolymers, and propylene-norbornene copolymers, and the copolymers thereof can also be used. In the case of a stereoregular resin, the stereoregularity may be isotactic, syndiotactic, or atactic.

In addition, when the resin component is a copolymer of an olefinic hydrocarbon and other monomers, examples of the other monomer for use include acrylic acid and the derivatives thereof, methacrylic acid and the derivatives thereof, maleic anhydride and the derivatives thereof, carboxylic vinyl esters, and the like. Examples of the copolymers include ethylene-vinyl acetate copolymers, ionomer resins, ethylene-ethyl acrylate copolymers, ethylene-acrylate copolymers, ethylene-methacrylate copolymers, acid-modified polyolefin-based resins obtained by modification of polyethylene or polypropylene with an unsaturated carboxylic acid such as acrylic acid, methacrylic acid, maleic anhydride, fumaric acid, or itaconic acid and the like.

When the multilayer sheet 10 of the present embodiment is used as a back sheet material for solar cells, a polyolefin-based resin having a melting point or glass transition temperature of 120° C. or higher is preferable and a high-density polyethylene and polypropylene having a melting point of 120° C. or higher is more preferable among the polyolefin-based resins above. The polyolefin-based resin for use is preferably an isotactic polypropylene, and, if used, the resin composition gives a back sheet for solar cells superior in mechanical strength and modulus of elasticity. As polypropylene shows favorable gas barrier properties when sheeted, it is possible by using polypropylene as the polyolefin-based resin layer 1 of the multilayer sheet 10 to give a solar cell module resistant to cell degradation due to water penetration.

On the other hand, the polyolefin-based resin composition forming the polyolefin-based resin layer 1 may contain a flame retardant, as needed. When the polyolefin-based resin layer 1 contains a flame retardant, the resin composition gives a back sheet for solar cells or a solar cell module less flammable even when it is exposed to arc discharge due to poor electrical connection or degradation.

The flame retardant added to the polyolefin-based resin composition is not particularly limited and examples thereof for use include chlorine-based flame retardants, bromine-based flame retardants, phosphorus-based flame retardants, inorganic flame retardants, and the like. Examples of the chlorine-based flame retardants include chlorinated paraffins, perchlorocyclopentadecane, chlorendic acid, and the like. Examples of the bromine-based flame retardants include tetrabromobisphenol A (TBA), decabromodiphenyl oxide, TBA epoxy oligomers, TBA polycarbonate, octabromodiphenylether, tribromophenol, and the like.

Examples of the phosphorus-based flame retardants include triphenyl phosphate, tricresyl phosphate, trixylenyl phosphate, tributyl phosphate, tris-chloroethyl phosphate, tris-chloropropyl phosphate, and the like. Examples of the inorganic flame retardants include aluminum hydroxide, magnesium hydroxide, antimony trioxide, and the like.

The polyolefin-based resin composition forming the polyolefin-based resin layer 1 may contain a weather-resistance improver such as an ultraviolet absorbent, a photostabilizer, or an antioxidant. It is possible by adding these weather-resistance improvers to improve the lightfastness and the durability of the multilayer sheet 10 further. The weather-resistance improver added to the polyolefin-based resin composition is not particularly limited and examples of the ultraviolet absorbents for use include benzophenone-, benzotriazole-, salicylate-, acrylonitrile-, and metal complex salt-based UV absorbents, titanium oxide ultrafine particles, zinc oxide ultrafine particles, and the like.

Examples of the photostabilizers for use include hindered amine compounds, hindered piperidine compounds, and the like. Further, examples of the antioxidant for use include phenol-, amine-, sulfur-, and phosphoric acid-based antioxidants and the like. In addition, a polymeric ultraviolet absorbent, a photostabilizer, an antioxidant, or the like containing a benzophenone-based ultraviolet absorbent described above, a hindered amine compound-based photostabilizer, or a phenol-based antioxidant chemically bound to the main or side chain of the polymer can also be used.

When the polyolefin-based resin layer 1 contains weather-resistance improvers such as an ultraviolet absorbent, a photostabilizer, and an antioxidant, the total amount thereof is preferably 0.1 to 10 mass % in the composition for expression of the advantageous effects of the weather-resistance improvers without deterioration of mechanical properties such as impact strength. The weather-resistance improvers may be used alone or in combination with the flame retardants described above.

[Polyvinylidene Fluoride-Based Resin Layer 2]

The polyvinylidene fluoride-based resin layer 2 is made of a polyvinylidene fluoride-based resin composition containing a polyvinylidene fluoride resin in an amount of 50 mass % or more with respect to all resin components. The polyvinylidene fluoride resin blended in the polyvinylidene fluoride-based resin composition is preferably a vinylidene fluoride homopolymer, but may be a copolymer of vinylidene fluoride with other monomers.

Examples of the other monomers copolymerized with vinylidene fluoride include fluorinated vinyl compounds such as vinyl fluoride, tetrafluoroethylene, trifluorochloroethylene, hexafluoropropylene, hexafluoroisobutylene, and various fluoroalkyl vinylethers; known vinyl monomers such as styrene, ethylene, butadiene, and propylene; and the like. However, for assurance of weather resistance and photostability over the polyvinylidene fluoride-based resin layer and the multilayer sheet, the content of the monomers other than vinylidene fluoride in the polyvinylidene fluoride resin is preferably 50 mass % or less.

The method for producing the polyvinylidene fluoride resin described above is not particularly limited, and it can be prepared by a common method such as suspension polymerization or emulsion polymerization. For example, a solvent such as water, a polymerization initiator, a suspending agent (or emulsifier), a chain-transfer agent, and others are placed in a tightly sealed reactor; gaseous vinylidene fluoride monomer is introduced into the reactor under reduced pressure produced by deaeration; and the vinylidene fluoride monomer is polymerized, while the reaction temperature is controlled. The polymerization initiator used then may be an inorganic peroxide such as a persulfate salt, an organic peroxide such as di-n-propylperoxydicarbonate (NPP) or diisopropylperoxydicarbonate, or the like.

Examples of the chain-transfer agents include acetone, isopropyl acetate, ethyl acetate, diethyl carbonate, dimethyl carbonate, ethyl carbonate, propionic acid, trifluoroacetic acid, trifluoroethylalcohol, formaldehyde dimethyl acetal, 1,3-butadiene epoxide, 1,4-dioxane, β-butylolactone, ethylene carbonate, vinylene carbonate, and the like. Among the various chain-transfer agents, acetone and ethyl acetate are particularly favorable from the viewpoint of availability and handleability. Further, examples of the suspending agents (or emulsifiers) for use include partially saponified polyvinylalcohols, water-soluble cellulose ethers such as methylcellulose and hydroxyethylcellulose, water-soluble polymers such as acrylic acid-based polymers and gelatin, and the like.

On the other hand, the polyvinylidene fluoride-based resin composition may contain a resin other than polyvinylidene fluoride resin and in particular, methacrylic ester resins are favorable from the viewpoints of flexibility and processability. The "methacrylic ester resin," as used herein, is for example a polymethyl methacrylate obtained by radical polymerization for example of methyl methacrylate prepared, for example, by the ACH, modified ACH, direct, or ethylene method.

When processed into a film, the methacrylic ester resin has an action to increase adhesiveness to other resins. Although polyvinylidene fluoride resins are lower in adhesiveness to other materials, they become more adhesive when blended with a methacrylic ester resin. However, when the methacrylic ester resin content in the resin components is more than 50 mass %, the resin becomes less weather resistant, as the content of the polyvinylidene fluoride resin decreases. Alternatively when the methacrylic ester resin content is less than 5 mass %, the favorable effect of the addition described above is not obtained. Thus, the amount of the methacrylic ester resin, if blended, is desirably 5 to 50 mass % with respect to the total amount of the resin components.

The methacrylic ester resin blended in the polyvinylidene fluoride-based resin composition is not particularly limited for example in its structure, if it is a vinyl polymer based on a methacrylic ester monomer. Examples of the methacrylic ester monomers include methyl methacrylate, ethyl methacrylate, propyl methacrylate, butyl methacrylate, pentyl methacrylate, hexyl methacrylate, and the like. It is particularly preferably methyl methacrylate. The alkyl group in the methacrylic ester monomer, such as propyl, butyl, pentyl, or hexyl, may be a straight- or branched-chain group.

The methacrylic ester resin blended in the resin composition in the embodiment may be a homopolymer of a methacrylic ester monomer or a copolymer of multiple methacrylic ester monomers. Alternatively, it may contain a monomer unit derived from a known vinyl compound other than methacrylic esters, such as ethylene, propylene, butadiene, styrene, α-methylstyrene, acrylonitrile, or acrylic acid.

The polyvinylidene fluoride-based resin composition forming the polyvinylidene fluoride-based resin layer 2 may contain, as needed, a white inorganic pigment such as magnesium oxide, barium sulfate, titanium oxide, basic lead carbonate, or zinc oxide for improvement of photoreflectivity. When the multilayer sheet 10 of the present embodiment is used in the solar cell application, rutile-type crystalline titanium dioxide is favorable among various white inorganic pigments, as it is higher in refractive index and coloring power and lower in photocatalytic activity.

However, when the blending amount of the white inorganic pigment is less than 1 part by mass with respect to 100 parts by mass of the resin components, it may not be possible to obtain desired photoreflection properties and, when it is more than 40 parts by mass with respect to 100 parts by mass of the resin components, the pigment may be dispersed unevenly in the composition, making it difficult to form a film. Accordingly when a white inorganic pigment is blended in the polyvinylidene fluoride-based resin composition, the addition amount is preferably 1 to 40 parts by mass with respect to 100 parts by mass of the resin components.

The amount of the white inorganic pigment blended is more preferably 10 to 35 parts by mass and still more preferably 15 to 30 parts by mass, with respect to 100 parts by mass of the resin components. It is thus possible to obtain a multilayer sheet higher in sunlight reflectance, appropriate in mechanical strength and flexibility and favorable in handleability.

The polyvinylidene fluoride-based resin composition may contain a white inorganic pigment described above and an inorganic coloring pigment in combination. The inorganic coloring pigment for use may be, for example, a complex oxide pigment prepared by using two or more oxides selected from the metal materials such as chromium, zinc, iron, nickel, aluminum, cobalt, manganese, and copper and converting them into solid solution by sintering. The complex oxide pigments may be used alone or in combination of two or more.

When an inorganic coloring pigment is blended in the polyvinylidene fluoride-based resin composition, its addition amount is preferably 0.01 to 7 parts by mass, more preferably 0.1 to 5 parts by mass, and still more preferably 0.5 to 3 parts by mass, with respect to 100 parts by mass of the resin components. It is possible in this way to regulate the sunlight reflectance in the range that does not impair the power-generating characteristics of the solar cell module and to modify the appearance and the color of the solar cell module.

The polyvinylidene fluoride-based resin composition described above is prepared by mixing, as needed, a methacrylic ester resin, a white inorganic pigment and an inorganic coloring pigment, and others with the polyvinylidene fluoride resin and melt-extruding the mixture. Various mixers and kneaders equipped with a heating device such as twin-screw extruders and continuous and batch kneaders can be used then for melt extrusion, but the apparatus most favorable for melt extrusion is a twin-screw extruder from the point of flexibility in use. Alternatively, a dispersant may be added, as needed, during the melt extrusion in an amount in the range that does not impair the favorable effects described above.

[Adhesion Resin Layer 3]

The adhesion resin layer 3 is made of a conjugated diene-based polymer, the copolymer, or the hydride thereof. When it is used as the adhesion resin layer 3, the layer permits adhesion of the non-polar polyolefin-based resin to the polar polyvinylidene fluoride-based resin. As the polyolefin-based resin layer 1 and the polyvinylidene fluoride-based resin layer 2 are adhered to each other tightly with the adhesion resin layer 3, the favorable adhesiveness can be retained as stabilized even at a high temperature of around 120° C. As a result, the multilayer sheet 10 becomes sufficiently durable under the use environment of solar cell modules.

The adhesion resin layer 3 is preferably made of a homopolymer of a conjugated diene having 4 to 8 carbon atoms, a copolymer of a conjugated diene having 4 to 8 carbon atoms and other monomers, or the hydride thereof and, among the conjugated dienes above, butadiene and isoprene are particularly favorable. Examples of the conjugated diene-based polymers and copolymers include polybutadiene, polyisoprene, butadiene-styrene copolymers, isoprene-styrene copolymers, and the like.

For example, when the adhesion resin layer 3 is made of a copolymer of a conjugated diene having 4 to 8 carbon atoms and an aromatic vinyl compound or the hydride thereof, the resulting multilayer sheet retains its durability and adhesive strength over an extended period of time. From the viewpoints of durability and adhesive strength, copolymers of a conjugated diene having 4 to 8 carbon atoms and an aromatic vinyl compound or the hydride thereof, such as hydrogenated butadiene-styrene copolymers and hydrogenated isoprene-styrene copolymers are particularly favorable.

From the viewpoint of strength, the adhesion resin layer 3 is preferably the hydride of a copolymer of a block-type conjugated diene-based compound and an aromatic vinyl compound, such as a hydrogenated butadiene-styrene block copolymer (SEBS) or a hydrogenated isoprene-styrene block copolymer (SEPS). The block copolymer is not particularly limited in shape and may be a diblock, triblock, multiblock, or a star-shaped copolymer. Further, these polymers may be modified, for example, terminally.

[MFR]

The polyolefin-based resin layer 1 and the polyvinylidene fluoride-based resin layer 2 have a melt flow rate (MFR), as determined by the method A specified in JIS K7210, of 0.5 to 25 g/10 minutes at 230° C. under a load of 2.16 kg. The adhesion resin layer 3 has a melt flow rate (MFR), as determined by the method A specified in JIS K7210, of 0.1 to 50 g/10 minutes at 230° C. under a load of 2.16 kg.

If the resin layers constituting the multilayer sheet 10 are formed respectively with resin compositions or polymers having an MFR in the range described above, for example when a film is formed by melting-coextrusion molding method, the resins flowing in respective channels in the molten state have a smaller resin flow rate distribution and thus, the resins are fed to the confluent point roughly at the same speed and the resins are discharged from the dice in the state without fluctuation in discharge rate. It is thus possible to produce a multilayer sheet smaller in fluctuation of the thickness of each layer and favorable in adhesion state. In addition, the dispersion state of the pigment contained in the polyvinylidene fluoride-based resin composition is also improved, leading to suppression of generation of defects.

Alternatively when the multilayer sheet 10 is produced, for example, by forming the respective resin layers separately and adhering them under heat and pressure, it is also possible, by forming the resin layers respectively with resin compositions or polymers having an MFR in the range described above, to uniformize the softening and melting behaviors of the resin layers and improve the adhesiveness between the respective resin layers over the entire area.

If the polyolefin-based resin layer 1 and/or the polyvinylidene fluoride-based resin layer 2 is formed with a resin composition having an MFR of less than 0.5 g/10 minutes, the molten polymer becomes more viscous, making it difficult to adjust the thickness of the layer to a desired value, for example when it is processed by the melting-coextrusion molding method. Also when the resin layers are formed separately and adhered under heat and pressure, the resin layers are not softened sufficiently, making it difficult to achieve high adhesive strength. Although the temperature may be raised during molding to overcome the problem above, there are concerns then about coloration of the polyvinylidene fluoride-based resin 2 and generation of decomposition gases.

Alternatively when the polyolefin-based resin layer 1 and/or the polyvinylidene fluoride-based resin layer 2 is formed with a resin composition having an MFR of more than 25 g/10 minutes, it is difficult to obtain a multilayer sheet having a desired thickness by the melting-coextrusion molding method. Yet alternatively when the resin layers are formed separately and adhered under heat and pressure, there may be observed more easily some fluctuation in thickness of the resin layers.

When the adhesion resin layer 3 is formed with a polymer, a copolymer, or the hydride thereof having an MFR of less than 0.1 g/10 minutes, it is not possible to obtain sufficient adhesive strength. Alternatively when it is formed, for example, with a polymer having an MFR of more than 50 g/10 minutes, the fluctuation in thickness of the adhesion resin layer 3 readily becomes larger, making it difficult to uniformize the adhesiveness between respective resin layers over the entire area.

When the multilayer sheet 10 is formed by the coextrusion molding method, resin compositions having a relative MRF of 0.1 to 10, preferably 0.2 to 5, as compared to 1 of the MRF of the polyolefin-based resin layer 1 are preferably used for the polyvinylidene fluoride-based resin layer 2 and the adhesive resin layer 3. It is possible in this way to stabilize film-forming efficiency and reduce the fluctuation in thickness of the resin layers in the sheet width direction.

The MFR of each resin layer can be adjusted, for example, by modifying the polymerization degree of the resin component contained therein. Specifically, it can be adjusted, for example, by modifying the polymerization temperature when the resin component is polymerized, the kind and the amount of the polymerization initiator used, and the kind and the amount of the chain-transfer agent used. It is also possible to use a commercially available resin having an MFR in the range described above.

[Thickness]

The thickness of each layer described above is not particularly limited and can be determined arbitrarily according to the application and the desired properties of the final product, but, for example, the polyolefin-based resin layer 1 may have a thickness of 50 to 500 μm and the polyvinylidene fluoride-based resin layer 2 and the adhesion resin layer 3 may have a thickness of 5 to 50 μm.

When the thickness of the polyolefin-based resin layer 1 is less than 50 μm, the multilayer sheet 10 may become too mechanically fragile, easily leading to breakdown of cells, when it is used in a solar cell module, and insufficient in steam barrier properties, easily leading to degradation of cells and deterioration in power output. Alternatively when the polyolefin-based resin layer 1 has a thickness of more than 500 μm, the multilayer sheet 10 becomes too rigid, leading to deterioration of handling efficiency such as winding efficiency and also to increase of production cost.

Alternatively when the thickness of the polyvinylidene fluoride-based resin layer 2 is less than 5 μm, the multilayer sheet shows declined weather resistance and possibly gives a solar cell module with insufficient durability. Yet alternatively when the polyvinylidene fluoride-based resin layer 2 has a thickness of more than 50 μm, the production cost increases.

Further when the adhesion resin layer 3 has a thickness of less than 5 μm, the adhesiveness between the polyolefin-based resin layer 1 and the polyvinylidene fluoride-based resin layer 2 declines, easily leading to delamination. As a result, when used in a solar cell module, it may show insufficient durability. Alternatively when the adhesion resin layer 3 has a thickness of more than 50 μm, the production cost increases.

[Production Method]

Hereinafter, a method for producing a multilayer sheet 10 in the configuration described above will be described. The multilayer sheet 10 in the present embodiment is preferably produced by the coextrusion method of melt-extruding the resin compositions for polyolefin-based resin layer 1 and polyvinylidene fluoride-based resin layer 2 and a polymer for adhesion resin layer 3 separately in different extruders and mixing and integrating them into a multilayer film.

In particular, these resins are preferably melt-coextruded and molded at a material temperature of 130 to 260° C. It is thus possible to keep the resin compositions and the polymer for respective layers in the stabilized melt-flow state and prevent thermal decomposition of them. When the material temperature during filming is lower than 130° C., the resin or polymer may be melted insufficiently, leading to formation of fish eyes in the resulting sheet or insufficient adhesion between the layers. Alternatively when the material temperature during filming is higher than 260° C., the resin component for each layer may be thermal decomposed, leading to coloration of the sheet or generation of decomposition gases. The material temperature during filming is more favorably 180 to 250° C.

The coextrusion methods include, for example, a T die-coextrusion method and an inflation-coextrusion method. The extruder for use may be, for example, a single-screw extruder or a twin-screw (multiaxial) extruder, and the cylinder and the screw of the extruder for use may be those commonly used. Further, the twin-screw extruder, if used, may be an extruder having two screws in parallel or an conical extruder having oblique screw axes. It may be an extruder with its screw flights intermeshed or non-intermeshed with it screw rotations in the same direction or in the opposite direction.

As for screw design in the case of a single-screw extruder, various mixers such as Dulmage-, rotor-, flute mixing-type mixers can be used as the mixing unit and the resins can be melted and sheeted in an extruder having no such a mixing unit. In the case of a twin-screw extruder, a kneading disk, a rotor segment, a reverse screw flight, or the like may be used as the mixing unit, but a full-flight screw having no such a mixing unit may also be used. The cylinder for use may be a vent- or no-vent-type cylinder.

For example for mixing of the resin compositions for polyolefin-based resin layer 1 and polyvinylidene fluoride-based resin layer 2 and the polymer for adhesion resin layer 3 and preparation of the multilayer sheet, a method of mixing the resins in a feed block, feeding the mixture for example to a flat die (T die), discharging a sheet therefrom in the molten state, and cooling and winding the resulting sheet may be used. The flat die used then may be a T-shaped manifold die, a fish-tail die, a coat-hanger die, a screw die, or the like. It is also possible to use, for example, a method of feeding the resin components to a multimanifold die and discharging a sheet therefrom in the molten state or a method of discharging it out of an inflation die.

When a film is produced by the coextrusion method, it is possible to adjust the thickness of each resin layer in the range described above by modifying the rate of discharging the material form the extruder. In the case of a single-screw extruder, the discharge rate is regulated by modification of the screw rotation frequency. Alternatively in the case of a twin-screw extruder, it can be regulated by modification of the rate of the raw materials fed into the extruder from the feeders, the screw rotation frequencies of the extruder, or the rotation frequencies of the gear pumps.

The production method for the multilayer sheet 10 is not limited to the coextrusion molding method described above and, for example, it may be prepared by a method of layering a previously-prepared polyolefin-based resin film, adhesion resin film, and polyvinylidene fluoride-based resin film in that order and adhering them under pressure, for example, with a roll under the condition of a temperature of 130 to 260° C.

Alternatively, it may be prepared by an extrusion-lamination molding method of applying an adhesion resin film in the molten state and a polyvinylidene fluoride-based resin film in the molten state on a polyolefin-based resin film previously prepared and adhering them under pressure for example with a roll. In the case of this method, an adhesion resin film in the molten state and a polyolefin-based resin film in the molten state may be formed on a polyvinylidene fluoride-based resin film previously prepared and the laminate adhered under pressure for example with a roll.

As described above in detail, as the multilayer sheet 10 of the present embodiment has a polyvinylidene fluoride-based resin layer 2, it is superior in weather resistance and heat resistance. In addition, as the adhesion resin layer 3 is made of a conjugated diene-based polymer, a conjugated diene-based copolymer, or the hydride thereof, the adhesiveness between the polyolefin-based resin layer 1 and the polyvinylidene fluoride-based resin layer 2 is improved. It is thus possible to obtain a multilayer sheet favorable as a back sheet for solar cells, i.e., a multilayer sheet superior in weather resistance, heat resistance, mechanical strength, modulus of elasticity, electrical insulating properties, and moisture proofness and also favorable in interlayer adhesiveness.

Modification of First Embodiment

Hereinafter, a multilayer sheet of a modification of the first embodiment of the present invention will be described. In the multilayer sheet of the modified embodiment, an ethylene-vinyl acetate copolymer (EVA) resin layer is formed additionally at least on the polyolefin-based resin layer 1 of the multilayer sheet 10 shown in FIG. 1.

[EVA Resin Layer]

The EVA resin layer can be formed with a EVA resin composition commonly used as a sealing material for solar cell modules. Examples of the EVA resin compositions include those containing an ethylene-vinyl acetate copolymer resin having a vinyl acetate content of 10 to 30 mass % as the major component and an organic peroxide generating radicals at 100° C. or higher as the crosslinking agent in an amount of 1 to 5 parts by mass with respect to 100 parts by mass of the EVA resin.

In the multilayer sheet of the modified embodiment, as an EVA resin layer is formed at least on the polyolefin-based resin layer 1 and the back sheet and the sealing material are integrated, it is possible to simplify the assembly step for production of solar cell modules. Specifically, although glass, a sealant sheet, a cell, a sealant sheet and a back sheet are layered and laminated in that order in the assembly step for a solar cell module, it is possible by using the multilayer sheet to eliminate the step of laminating the sealant sheet with the back sheet. Additionally in the multilayer sheet of the modified embodiment, it is also possible to prevent the position aberration between the sealing material and the back sheet in the solar cell module.

Second Embodiment

Hereinafter, a back sheet for solar cells (hereinafter, referred to simply as back sheet) in the second embodiment of the present invention will be described. The back sheet in the present embodiment is prepared from the multilayer sheet of the first embodiment or the modified embodiment thereof described above.

The back sheet of the present embodiment can be used in various types of solar cells such as crystalline silicon-, polycrystalline silicon-, amorphous silicon-, compound- and organic solar cells. Thin-film solar cells containing for example amorphous silicon are required to have higher moisture proofness, compared to crystal-based solar cells. In such a case, a moisture-proof layer or a moisture-proof coat layer, for example of an inorganic oxide, that is higher in moisture proofness may be formed additionally on the multilayer sheet of the first embodiment or the modified embodiment thereof described above.

The back sheet of the present embodiment, which is a laminate of a polyolefin-based resin layer and a polyvinylidene fluoride-based resin layer laminated via an adhesion resin layer of a conjugated diene-based polymer, a conjugated diene-based copolymer, or the hydride thereof, is superior in weather resistance, heat resistance, mechanical strength, modulus of elasticity, electrical insulating properties, and moisture proofness and also favorable in interlayer adhesiveness.

In particular when polypropylene is used as the resin component for the polyolefin-based resin layer 1, it is possible to improve the moisture proofness further and thus the back sheet of the present embodiment can suppress degradation of the solar cell module over time and improve the reliability thereof.

Third Embodiment

Figure 2:
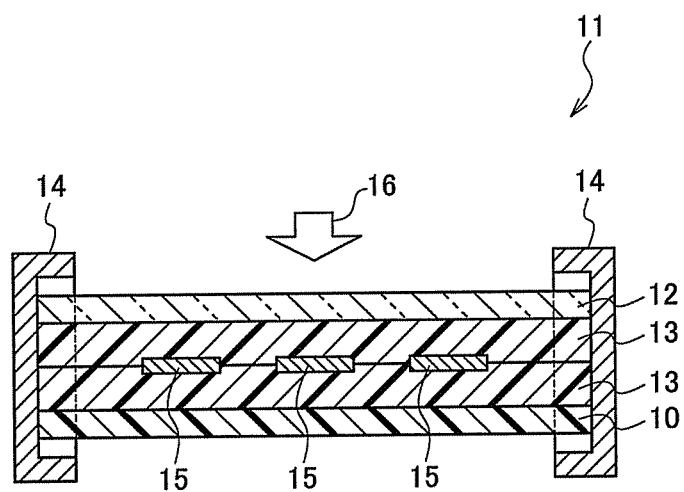
FIG. 2 is a schematic sectional view illustrating the configuration of a solar cell module in the third embodiment of the present invention.

Hereinafter, a solar cell module in the third embodiment of the present invention will be described. FIG. 2 is a schematic sectional view illustrating the solar cell module in the present embodiment. As shown in FIG. 2, in the solar cell module 11 of the embodiment, solar cells 15, as photoelectromotive element, are sealed with a sealing material 13 of a synthetic resin such as an EVA resin.

A transparent substrate 12 for example of glass is placed on the face exposed to sunlight 16, while the back sheet (multilayer sheet 10) of the second embodiment described above is on the rear face, and the composite is surrounded by a frame 14 on the periphery. The back sheet (multilayer sheet 10) is formed then in the conformation with its polyolefin-based resin layer 1 facing the sealing material 13.

The solar cell module 11 of the present embodiment, in which a multilayer sheet 10 having a polyolefin-based resin layer and a polyvinylidene fluoride-based resin layer laminated via an adhesion resin layer of a conjugated diene-based polymer, a conjugated diene-based copolymer, or the hydride thereof is used as the back sheet, is superior in weather resistance, heat resistance, mechanical strength, modulus of elasticity, electrical insulating properties, and moisture proofness and also higher in reliability.

EXAMPLE

Hereinafter, advantageous effects of the present invention will be described with reference to the Inventive Examples and Comparative Examples. In the Examples below, the multilayer sheets of Examples 1 to 12 and Comparative Examples 1 to 10 were prepared by the method described below and the properties thereof after converted to a back sheet for solar cells were examined. In the description below, the value of MFR is a value as determined at 230° C. under a load of 2.16 kg according to the method A of JIS K7210, unless specified otherwise.

Example 1

A random polypropylene resin (trade name: NOBLEN FH3315 manufactured by Sumitomo Chemical Co., Ltd., MFR: 3.0 g/10 minutes, melting point: 143° C.) was used as the raw material for the polyolefin-based resin layer 1. Alternatively, the hydride of a styrene-butadiene-styrene block copolymer (SEBS, trade name: Tuftec H1053 manufactured by Asahi Kasei Corp., MFR: 1.8 g/10 minutes) was used as the raw material for the adhesion resin layer 3.

A mixture of a black pigment of a solid solution of chromium, manganese, and copper oxides as coloring pigment: 1 part by mass (1 mass %), a rutile crystalline titanium dioxide powder as white inorganic pigment: 20 parts by mass (16 mass %), a polyvinylidene fluoride resin (MFR: 5 g/10 minutes): 80 parts by mass (65 mass %), and a polymethyl methacrylate resin (MFR: 2 g/10 minutes): 20 parts by mass (16 mass %) prepared in a Henschel Mixer (MFR: 4.7 g/10 minutes) was used as the raw material for the polyvinylidene fluoride-based resin layer 2.

Then, the raw materials for respective resin layers were filmed respectively, using a heat-pressing machine under the condition of 200° C. and 5 MPa, to give three kinds of films. The polyolefin-based resin layer 1 had a thickness of 320 µm, the adhesion resin layer 3 of 50 µm, and the polyvinylidene fluoride-based resin layer 2 of 50 µm. Then, these three films were layered and integrated with a vacuum laminator, as heat-pressed at 160° C. and 0.1 MPa, to give a multilayer sheet of Example 1.

<Preparation of Solar Cell Module>

Then, a solar cell module was prepared, using the multilayer sheet of Example 1 prepared by the method described above method. Specifically, a glass plate having a thickness of 3 mm, a sealant sheet of an ethylene-vinyl acetate copolymer having a thickness of 400 µm, four polycrystalline silicon cells arranged in series, a sealant sheet, and a back sheet (multilayer sheet of Example 1) are layered in that order, and the composite was laminated under heat and pressure in a vacuum laminator under an atmospheric pressure at 135° C. for 10 minutes, to give a solar cell module.

<Evaluation Method>

(1) Evaluation of the Adhesive Strength of the Layers in Multilayer Sheet

The interlayer peel strengths between the layers in the multilayer sheet of Example 1 were determined according to the "Adhesives—Determination of peel strength of bonded assemblies—Part 3 (T-peel test)" specified in JIS K6854-3. The shape of the sample used then was a stripe of 15 mm in width×250 mm in adhesion region length and the peeling rate in the peel test was 100 mm/minute. The peel strength of the multilayer sheet was also determined after it was stored under an environment of a temperature 85° C. and a humidity of 85% for 1000 hours. Further, the environmental test was continued for up to 3000 hours and the peel strength then was determined.

(2) Moisture Transmittance (Moisture Permeability)

The moisture permeability of the multilayer sheet of Example 1 was determined at 40° C. and a relative humidity of 90% according to the "Testing methods for determination of the water vapor transmission rate of moisture-proof packaging materials (dish method)" specified in JIS Z0208.

(3) Evaluation of the Weather Resistance of Solar Cell Module

An environmental test for 1000 hours at a temperature 85° C. and a humidity of 85% was performed according to the high-temperature high-humidity test specified in JIS C8990-10.13 and the maximum power outputs before and after the test were determined on a solar simulator and the diminution rate of the maximum power was determined. Similar measurements were performed after 2000 hours and after 3000 hours.

Example 2

A multilayer sheet was prepared in a manner similar to Example 1 described above, except that a high-density polyethylene resin (trade name: Novatec HF560 manufactured by Japan Polyethylene Corp., MFR: 7.0 g/10 minutes, melting point: 134° C.) was used as the raw material for the polyolefin-based resin layer 1. The polyolefin-based resin layer 1 had a thickness of 320 μm, the adhesion resin layer 3 of 50 μm, and the polyvinylidene fluoride-based resin layer 2 of 50 μm.

Example 3

A multilayer sheet was prepared in a manner similar to Example 1 described above, except that the hydride of a styrene-isoprene-styrene block copolymer (SEPS, trade name: Septon 2007 manufactured by Kuraray Plastics Co., Ltd., MFR: 2.4 g/10 minutes) was used as the raw material for the adhesion resin layer 3. The polyolefin-based resin layer 1 had a thickness of 320 μm, the adhesion resin layer 3 of 50 μm, and the polyvinylidene fluoride-based resin layer 2 of 50 μm.

Example 4

A multilayer sheet was prepared in a manner similar to Example 1 described above, except that a mixture of a black pigment of a solid solution of chromium, manganese, and copper oxides as coloring pigment: 1 part by mass (1 mass %), a rutile crystalline titanium dioxide powder as white inorganic pigment: 20 parts by mass (16 mass %), a polyvinylidene fluoride resin (MFR: 5 g/10 minutes): 50 parts by mass (40 mass %), and a polymethyl methacrylate resin (MFR: 2 g/10 minutes): 50 parts by mass (40 mass %) prepared in a Henschel Mixer (MFR: 4.0 g/10 minutes) was used as the raw material for the polyvinylidene fluoride-based resin layer 2. The polyolefin-based resin layer 1 had a thickness of 320 μm, the adhesion resin layer 3 of 50 μm, and the polyvinylidene fluoride-based resin layer 2 of 50 μm.

Example 5

Preparation of the Raw Material for Polyolefin-Based Resin Layer 1

A random polypropylene resin (trade name: NOBLEN FH3315, manufactured by Sumitomo Chemical Co., Ltd.): 300 kg, a phosphate ester-based flame retardant as flame-proofing agent (trade name: Adekastab FP-500, manufactured by ADEKA Corporation): 45 kg, and a benzophenone-based ultraviolet absorbent as ultraviolet absorbent (trade name: Sumisorb 130, manufactured by Sumitomo Chemical Co., Ltd.): 2 kg were used as the raw materials for the polyolefin-based resin layer 1 and mixed dry in a mixer. The polyolefin-based resin composition obtained had an MFR of 3.0 g/10 minutes.

<Preparation of the Raw Material for Adhesion Resin Layer 3>

The hydride of a styrene-butadiene-styrene block copolymer (SEBS, trade name: Tuftec H1053, manufactured by Asahi Kasei Corp., MFR: 1.8 g/10 minutes): 30 kg was used as the raw material for the adhesion resin layer 3.

<Preparation and Production of the Raw Material for Polyvinylidene Fluoride-Based Resin Layer 2>

A black pigment of a solid solution of chromium, manganese, and copper oxides as coloring pigment: 1 kg, a rutile crystalline titanium dioxide powder as white inorganic pigment: 20 kg were used and mixed in a mixer. A twin-screw extruder (screw diameter: 30 mm, L/D: 40) was used as the kneading apparatus for preparation of the resin composition and three screw feeders A to C were connected to the raw material-inlet of the extruder and a strand die having three holes with a hole diameter of 3 mm to the outlet of the extruder.

A mixture of a coloring pigment and titanium dioxide was placed in feeder A, and a polyvinylidene fluoride resin having an MFR, as determined by the MFR measurement method specified by the method A of JIS K7210, of 20 g/10 minutes at 230° C. under a load of 3.8 kg was placed in feeder B. In addition, a polymethyl methacrylate resin having an MFR, as determined by the MFR measurement method specified by the method A of JIS K7210, of 9 g/10 minutes at 230° C. under a load of 10 kg (hereinafter, referred to as PMMA) was placed in feeder C.

The mixture of the coloring pigment and titanium dioxide placed in feeder A was fed at a feed rate of 5.25 kg/hour, the polyvinylidene fluoride resin placed in feeder B at a feed rate of 20.00 kg/hour, and the PMMA placed in feeder C at a feed rate of 5.00 kg/hour. And, these materials were extruded out of a strand die, as the twin-screw extruder was operated at a rotational frequency of 300 revolution/minute and a barrel temperature setting of 230° C.

The strands extruded were cooled and cut in a pelletizer, to give a pellet-shaped resin composition having a diameter of approximately 2 mm and a length of approximately 4 mm in an amount of 60 kg. The resin composition obtained had a blend composition of 80 parts by mass (66 mass %) of the polyvinylidene fluoride resin, 20 parts by mass (16 mass %) of the PMMA, 20 parts by mass (17 mass %) of the white inorganic pigment, and 1 part by mass (1 mass %) of the coloring pigment and had an MFR of 4.7 g/10 minutes.

<Preparation of Multilayer Sheet>

Three single-screw extruders were connected as a triple-layer coextrusion device to a 3-kind 3-layer feed block, which is connected to a coat hanger die having a lip width of 600 mm, so that the 3-layer resin stream formed as combined in the feed block flows into the die. The tree single-screw extruders had the following specifications:

Extruder 1 (for polyolefin-based resin layer 1): screw diameter: 90 mm, L/D: 30, screw: full-flight screw;

Extruder 2 (for adhesion resin layer 3): screw diameter 40 mm, L/D: 30, screw: full-flight screw; and Extruder 3 (for polyvinylidene fluoride-based resin layer 2): screw diameter 40 mm, L/D: 30, screw: full-flight screw.

Then, the raw materials for respective resin layers described above were placed in the hoppers to extruders 1 to 3 and the extruders were operated under the following conditions:

Extruder 1 (for polyolefin-based resin layer 1): screw rotation number: 100 revolution/minute, extrusion rate: 150 kg/hour, extruder barrel temperature setting: 230° C.;

Extruder 2 (for adhesion resin layer 3): screw rotation number: 25 revolution/minute, extrusion rate: 15 kg/hour, extruder barrel temperature setting: 230° C.; and Extruder 3 (for polyvinylidene fluoride-based resin layer 2): screw rotation number: 25 revolution/minute, extrusion rate: 10 kg/hour, extruder barrel temperature setting: 230° C.

The resins extruded from the extruders 1 to 3 are mixed in the feed block, extruded out of the coat hanger die set to have a lip opening of 0.5 mm, and cooled, as the hot sheet is held between two chill rolls in a take-off machine, to give a multilayer sheet. The multilayer sheet obtained was then sent to a winding machine and wound into a roll. In the multilayer sheet of Example 5, the polyolefin-based resin layer 1 had a thickness of 300 μm, the adhesion resin layer 3 had a thickness of 20 μm, and the polyvinylidene fluoride-based resin layer 2 had a thickness of 20 μm. The layers were adhered to each other completely.

Example 6

A multilayer sheet was prepared in a manner similar to Example 5 described above, except that the hydride of an isoprene-styrene block copolymer (SEP, manufactured by Kuraray Co., Ltd. trade name: Septon 1001, MFR: 0.1 g/10 minutes) was used as the raw material for the adhesion resin layer 3. The polyolefin-based resin layer 1 had an average thickness of 300 μm, the adhesion resin layer 3 of 20 μm, and the polyvinylidene fluoride-based resin layer 2 of 20 μm. In the multilayer sheet of Example 6, there was some fluctuation in thickness of the adhesion resin layer 3 (minimum thickness: 15 μm, maximum thickness: 25 μm), but it was at a level practically without any problem. In addition, the layers were adhered to each other completely.

Example 7

A multilayer sheet was prepared in a manner similar to Example 5 described above, except that the hydride of a styrene-butadiene-styrene block copolymer (SEBS, manufactured by Kuraray Co., Ltd. trade name: Septon 8076, MFR: 50 g/10 minutes) was used as the raw material for the adhesion resin layer 3. The polyolefin-based resin layer 1 had an average thickness of 300 μm, the adhesion resin layer 3 of 20 μm, and the polyvinylidene fluoride-based resin layer 2 of 20 μm. In the multilayer sheet of Example 7, there was some fluctuation in thickness of the adhesion resin layer 3 (minimum thickness: 16 μm, maximum thickness: 25 μm), but it was at a level practically without any problem. In addition, the layers were adhered to each other completely.

Example 8

A multilayer sheet was prepared in a manner similar to Example 5 described above, except that a polypropylene resin (trade name: NOBLEN FH1016 manufactured by Sumitomo Chemical Co., Ltd., MFR: 0.5 g/10 minutes) was used as the raw material for the polyolefin-based resin layer 1. The polyolefin-based resin layer 1 had an average thickness of 300 μm, the adhesion resin layer 3 of 20 μm, and the polyvinylidene fluoride-based resin layer 2 of 20 μm. In the multilayer sheet of Example 8, there was some fluctuation in thickness of the polyolefin-based resin layer 1 (minimum thickness: 290 μm, maximum thickness: 310 μm), but it was at a level practically without any problem. In addition, the layers were adhered to each other completely.

Example 9

A multilayer sheet was prepared in a manner similar to Example 5 described above, except that a polypropylene resin (trade name: NOBLEN Z101 manufactured by Sumitomo Chemical Co., Ltd., MFR: 25 g/10 minutes) was used as the raw material for the polyolefin-based resin layer 1. The polyolefin-based resin layer 1 had an average thickness of 300 μm, the adhesion resin layer 3 of 20 μm, and the polyvinylidene fluoride-based resin layer 2 of 20 μm. In the multilayer sheet of Example 9, there was some fluctuation in thickness of the polyolefin-based resin layer 1 (minimum thickness: 290 μm, maximum thickness: 310 μm), but it was at a level practically without any problem. In addition, the layers were adhered to each other completely.

Example 10

A multilayer sheet was prepared in a manner similar to Example 5 described above, except that, in preparation and production of the polyvinylidene fluoride-based resin layer 2, a polyvinylidene fluoride resin having an MFR, as determined by the MFR measurement method specified by method A of JIS K7210, of 15 g/10 minutes at 230° C. under a load of 12.5 kg was placed in feeder B; PMMA having an MFR, as determined by the MFR measurement method specified by method A of JIS K7210, of 9 g/10 minutes at 230° C. under a load of 10 kg was placed in feeder C; and a pellet-shaped polyvinylidene fluoride-based resin composition having an MFR of 0.5 g/10 minutes was obtained.

The polyolefin-based resin layer 1 had an average thickness of 300 μm, the adhesion resin layer 3 of 20 μm, and the polyvinylidene fluoride-based resin layer 2 of 20 μm. In the multilayer sheet of Example 10, there was some fluctuation in thickness of the polyvinylidene fluoride-based resin layer 2 (minimum thickness: 17 μm, maximum thickness: 23 μm), but it was at a level practically without any problem. In addition, the layers were adhered to each other completely.

Example 11

A multilayer sheet was prepared in a manner similar to Example 5 described above, except that, in preparation and production of the polyvinylidene fluoride-based resin layer 2, a polyvinylidene fluoride resin having an MFR, as determined by the MFR measurement method specified by method A of JIS K7210, of 25 g/10 minutes at 230° C. under a load of 3.8 kg was placed in feeder B; PMMA having an MFR, as determined by the MFR measurement method specified by method A of JIS K7210, of 35 g/10 minutes at 230° C. under a load of 3.8 kg was placed in feeder C; and a pellet-shaped polyvinylidene fluoride-based resin composition having an MFR of 25 g/10 minutes was obtained.

The polyolefin-based resin layer 1 had an average thickness of 300 μm, the adhesion resin layer 3 of 20 μm, and the polyvinylidene fluoride-based resin layer 2 of 20 μm. In the multilayer sheet of Example 11, there was some fluctuation in thickness of the polyvinylidene fluoride-based resin layer 2 (minimum thickness: 16 μm, maximum thickness: 22 μm), but it was at a level practically without any problem. In addition, the layers were adhered to each other completely.

Example 12

Similarly to Example 5 described above, a raw material for the polyolefin-based resin layer 1, a raw material for the adhesion resin layer 3, and a raw material for the polyvinylidene fluoride-based resin layer 2 (polyvinylidene fluoride-based resin composition) were made available. A single-layer film was prepared in a filming line consisting of a single screw extruder and a coat hanger die, using the raw material for the polyolefin-based resin layer 1. Then, in a production line consisting of two extruders, a feed block and a coat hanger die, wherein the resins fed through the extruders meets in a feed block and are extruded out of the die, a film of the raw material for adhesion resin layer 3 and the raw material for polyvinylidene fluoride-based resin layer 2 that were adhered to each other in the molten state was extruded on the top face of the polyolefin-based resin layer 1 previously prepared.

The composite was pressed and cooled in the state, to give a multilayer sheet in which the polyolefin-based resin layer 1, the adhesion resin layer 3, and the polyvinylidene fluoride-based resin layer 2 are adhered to each other and integrated. In the multilayer sheet of Example 6, the polyolefin-based resin layer 1 had a thickness of 300 μm, the adhesion resin layer 3 of 50 μm, and the polyvinylidene fluoride-based resin layer 2 of 50 μm.

Comparative Example 1

A multilayer sheet of Comparative Example 1 was prepared by layering a polyvinyl fluoride film, a polyethylene terephthalate (PET) film, and a polyvinyl fluoride film in that order, applying a urethane-based adhesive between the layers, and adhering and integrating the layers under heat and pressure. In the multilayer sheet of Comparative Example 1, the polyvinyl fluoride film had a thickness of 50 μm, the polyethylene terephthalate (PET) film of 320 μm, and the polyvinyl fluoride film of 50 μm.

Comparative Example 2

A multilayer sheet of Comparative Example 2 was prepared by using a polyolefin modified by introduction of epoxy groups as the material for the adhesion resin layer 3 and the raw materials of the Example above as raw materials for polyolefin-based resin layer 1 and polyvinylidene fluoride-based resin layer 2 and processing the raw materials under heat and pressure in a vacuum laminator at 160° C. and 0.1 MPa. The multilayer sheet of Comparative Example 2 had a very small initial peel strength and thus, could not be used in various tests.

Comparative Example 3

A multilayer sheet of Comparative Example 3 was prepared by processing the polyolefin-based resin layer 1 and polyvinylidene fluoride-based resin layer 2 prepared in a manner similar to Example 1 via a terpene-based hot melt adhesive under heat and pressure under the condition of 160° C. and 0.1 MPa. The multilayer sheet of Comparative Example 3 had a sufficiently high initial peel strength, but had a very small peel strength at high temperature (100° C.).

When the multilayer sheet of Comparative Example 3 was left under an environment of a temperature of 85° C. and a humidity of 85% for 100 hours, the sheet separated during the storage period and thus the peel strength after the environmental test could not be performed. Further, a solar cell module was prepared and subjected to the environmental test but, as the back sheet was separated, the battery degraded significantly, giving a very large maximum power diminution rate of 50%.

Comparative Example 4

The polyolefin-based resin layer 1 and the polyvinylidene fluoride-based resin layer 2 prepared by a method similar to Example 1 were laminated with various olefinic resins such as low-density polyethylene, medium-density polyethylene, high-density polyethylene, maleic acid-modified polyethylene, polypropylene, olefinic elastomers, cycloolefinic resins, ethylene-vinyl acetate copolymers, and ethylene-vinyl acetate-maleic anhydride copolymers, to give various multilayer sheets.

Then, the sheets were prepared under heat and pressure in a vacuum laminator under the condition of 160° C. and 0.1 MPa. Multilayer sheets were also prepared by a method similar to that above, using these resins different in melt viscosity. Any multilayer sheet was found to be not adhesive at all at the interface with the polyvinylidene fluoride-based resin composition or to have a very small peel strength, and could not be used in various tests.

Comparative Example 5

A multilayer sheet was prepared in a manner similar to Example 5 described above, except that the hydride of a styrene-butadiene-styrene block copolymer (SEBS, trade name: Septon 8004 manufactured by Kuraray Co., Ltd., MFR: 0.05 g/10 minutes) was used as the raw material for adhesive layer 3. The polyolefin-based resin layer 1 had an average thickness of 300 μm, the adhesion resin layer 3 of 20 μm, and the polyvinylidene fluoride-based resin layer 2 of 20 μm.

In the multilayer sheet of Comparative Example 5, the polyolefin-based resin layer 1 had a minimum thickness of 200 μm and a maximum thickness of 390 μm, the adhesion resin layer 3 had a minimum thickness of less than 1 μm and a maximum thickness of 43 μm, and the polyvinylidene fluoride-based resin layer 2 had a minimum thickness of 5 μm and a maximum thickness of 35 μm, and the fluctuation in thickness of the resin layers was large.

Comparative Example 6

A multilayer sheet was prepared in a manner similar to Example 5 described above, except that the hydride of a styrene-isoprene-styrene block copolymer (SEPS, trade name: Septon 2002 manufactured by Kuraray Co., Ltd., MFR: 70 g/10 minutes) was used as the raw material for the adhesive layer 3. The polyolefin-based resin layer 1 had an average thickness of 300 μm, the adhesion resin layer 3 of 20 μm, and the polyvinylidene fluoride-based resin layer 2 of 20 μm.

In the multilayer sheet of Comparative Example 6, the polyolefin-based resin layer 1 had a minimum thickness of 180 μm and a maximum thickness of 400 μm, the adhesion resin layer 3 had a minimum thickness of 2 μm and a maximum thickness of 37 μm, and the polyvinylidene fluoride-based resin layer 2 had a minimum thickness of 5 μm and a maximum thickness of 35 μm. The fluctuation in thickness of the resin layers was large.

Comparative Example 7

A multilayer sheet was prepared in a manner similar to Example 5 described above, except that a polypropylene resin (trade name: Novatec PP EA9FT manufactured by Japan Polypropylene, MFR: 0.4 g/10 minutes) was used, replacing the random polypropylene resin, as the raw material for polyolefin-based resin layer 1. The polyolefin-based resin layer 1 had an average thickness of 300 μm, the adhesion resin layer 3 of 20 μm, and the polyvinylidene fluoride-based resin layer 2 of 20 μm.

In the multilayer sheet of Comparative Example 7, the polyolefin-based resin layer 1 had a minimum thickness of 200 μm and a maximum thickness of 390 μm, and the adhesion resin layer 3 had a minimum thickness of 2 μm and a maximum thickness of 36 μm, and the fluctuation in thickness of the polyolefin-based resin layer 1 and the adhesion resin layer 3 was large. In addition, there were regions extremely lower in adhesive strength locally between the polyolefin-based resin layer 1 and the adhesion resin layer 3.

Comparative Example 8

A multilayer sheet was prepared in a manner similar to Example 5 described above, except that a polypropylene resin (trade name: NOBLEN AZ564 manufactured by Sumitomo Chemical Co., Ltd., MFR: 30 g/10 minutes) was used, replacing the random polypropylene resin, as the raw material for the polyolefin-based resin layer 1. The polyolefin-based resin layer 1 had an average thickness of 300 μm, the adhesion resin layer 3 of 20 μm, and the polyvinylidene fluoride-based resin layer 2 of 20 μm.

In the multilayer sheet of Comparative Example 8, the polyolefin-based resin layer 1 had a minimum thickness of 150 μm and a maximum thickness of 390 μm, the adhesion resin layer 3 had a minimum thickness of 3 μm and a maximum thickness of 34 μm, and the fluctuation in thickness of the polyolefin-based resin layer 1 and the adhesion resin layer 3 was large. In addition, there were regions extremely lower in adhesive strength locally between the polyolefin-based resin layer 1 and the adhesion resin layer 3.

Comparative Example 9

A multilayer sheet was prepared in a manner similar to Example 5 described above, except that, in preparation and production of the polyvinylidene fluoride-based resin layer 2, a polyvinylidene fluoride resin having an MFR, as determined by the MFR measurement method specified by method A of JIS K7210, of 5 g/10 minutes at 230° C. under a load of 12.5 kg was placed in feeder B; PMMA having an MFR, as determined by the MFR measurement method specified by method A of JIS K7210, of 9 g/10 minutes at 230° C. under a load of 10 kg was placed in feeder C; and a pellet-shaped polyvinylidene fluoride-based resin composition having an MFR of 0.3 g/10 minutes was obtained.

The polyolefin-based resin layer 1 had an average thickness of 300 μm, the adhesion resin layer 3 of 20 μm, and the polyvinylidene fluoride-based resin layer 2 of 20 μm. In the multilayer sheet of Comparative Example 9, the adhesion resin layer 3 had a minimum thickness of 4 μm and a maximum thickness of 30 μm and the polyvinylidene fluoride-based resin layer 2 had a minimum thickness of 5 μm and a maximum thickness of 37 μm, and the fluctuation in thickness of the adhesion resin layer 3 and the polyvinylidene fluoride-based resin layer 2 was large. In addition, there were regions extremely lower in adhesive strength locally between the adhesion resin layer 3 and the polyvinylidene fluoride-based resin layer 2.

Comparative Example 10

A multilayer sheet was prepared in a manner similar to Example 5 described above, except that, in preparation and production of the polyvinylidene fluoride-based resin layer 2, a polyvinylidene fluoride resin having an MFR, as determined by the MFR measurement method specified by method A of JIS K7210, of 25 g/10 minutes at 230° C. under a load of 12.5 kg was placed in feeder B; PMMA having an MFR, as determined by the MFR measurement method specified by method A of JIS K7210, of 40 g/10 minutes under a load of 3.8 kg was placed in feeder C; and a pellet-shaped polyvinylidene fluoride-based resin composition having an MFR of 27 g/10 minutes was obtained.

The polyolefin-based resin layer 1 had an average thickness of 300 μm, the adhesion resin layer 3 of 20 μm, and the polyvinylidene fluoride-based resin layer 2 of 20 μm. In the multilayer sheet of Comparative Example 10, the adhesion resin layer 3 had a minimum thickness of 3 μm and a maximum thickness of 32 μm and the polyvinylidene fluoride-based resin layer 2 had a minimum thickness of 7 μm and a maximum thickness of 38 μm, and the fluctuation in thickness of the adhesion resin layer 3 and the polyvinylidene fluoride-based resin layer 2 was large. In addition, there were regions extremely lower in adhesive strength locally between the adhesion resin layer 3 and the polyvinylidene fluoride-based resin layer 2.

The evaluation results are summarized in the following Tables 1 and 2.

TABLE 1

| | | Example 1 | Example 2 | Example 3 | Example 4 | Example 5 | Example 6 | Example 7 |
|---|---|---|---|---|---|---|---|---|
| Initial peel strength of multilayer sheet at room temperature (N/width 15 mm) | | >10 Breakage of material | >10 Breakage of material | >10 Breakage of material | >10 Breakage of material | >10 Breakage of material | 8.5 | >10 Breakage of material |
| Initial peel strength of multilayer sheet at 100° C. (N/width 15 mm) | | >10 Breakage of material | >10 Breakage of material | >10 Breakage of material | >10 Breakage of material | >10 Breakage of material | 8.5 | >10 Breakage of material |
| Moisture permeability of multilayer sheet (g/m² · 24 hours) | | 0.9 | 1.5 | 0.9 | 1.0 | 0.9 | 1.5 | 1.4 |
| Peel strength after environmental test | 1000 hours | >10 Breakage of material | >10 Breakage of material | >10 Breakage of material | >10 Breakage of material | >10 Breakage of material | 8.5 | >10 Breakage of material |
| | 3000 hours | >10 Breakage of material | >10 Breakage of material | >10 Breakage of material | >10 Breakage of material | >10 Breakage of material | 8.5 | >10 Breakage of material |
| Initial maximum power output (W) of module | | 14.6 | 14.5 | 14.7 | 14.9 | 14.8 | 14.6 | 14.6 |

TABLE 1-continued

| | | | | | | | | |
|---|---|---|---|---|---|---|---|---|
| Diminution rate (%) of maximum power between before and after environmental test | 1000 hours | 0.1 | 0.1 | 0.1 | 0.0 | 0.0 | 0.0 | 0.1 |
| | 2000 hours | 0.3 | 0.2 | 0.3 | 0.3 | 0.4 | 0.3 | 0.2 |
| | 3000 hours | 2.0 | 2.1 | 2.0 | 1.5 | 1.5 | 2.0 | 2.0 |

| | | Example 8 | Example 9 | Example 10 | Example 11 | Example 12 |
|---|---|---|---|---|---|---|
| Initial peel strength of multilayer sheet at room temperature (N/width 15 mm) | | >10 Breakage of material | >10 Breakage of material | >10 Breakage of material | >10 Breakage of material | >10 Breakage of material |
| Initial peel strength of multilayer sheet at 100° C. (N/width 15 mm) | | >10 Breakage of material | >10 Breakage of material | >10 Breakage of material | >10 Breakage of material | >10 Breakage of material |
| Moisture permeability of multilayer sheet (g/m² · 24 hours) | | 1.8 | 2.0 | 0.9 | 0.9 | 0.9 |
| Peel strength after environmental test | 1000 hours | >10 Breakage of material | >10 Breakage of material | >10 Breakage of material | >10 Breakage of material | >10 Breakage of material |
| | 3000 hours | >10 Breakage of material | >10 Breakage of material | >10 Breakage of material | >10 Breakage of material | >10 Breakage of material |
| Initial maximum power output (W) of module | | 14.6 | 14.6 | 14.6 | 14.6 | 14.6 |
| Diminution rate (%) of maximum power between before and after environmental test | 1000 hours | 0.1 | 0.1 | 0.1 | 0.1 | 0.0 |
| | 2000 hours | 0.4 | 0.3 | 0.3 | 0.4 | 0.3 |
| | 3000 hours | 2.0 | 2.1 | 1.9 | 2.0 | 1.5 |

TABLE 2

| | | Comparative Example 1 | Comparative Example 2 | Comparative Example 3 | Comparative Example 4 | Comparative Example 5 | Comparative Example 6 |
|---|---|---|---|---|---|---|---|
| Initial peel strength of multilayer sheet at room temperature (N/width 15 mm) | | >10 Breakage of material | 1.7 | >10 Breakage of material | Non-adhesive or <2 | >10 to 4.3 There is dispersion of values | >10 to 5.0 There is dispersion of values |
| Initial peel strength of multilayer sheet at 100° C. (N/width 15 mm) | | >10 Breakage of material | 1.6 | 2.1 | Non-adhesive or <2 | >10 to 4.5 There is dispersion of values | >10 to 5.2 There is dispersion of values |
| Moisture permeability of multilayer sheet (g/m² · 24 hours) | | 1.7 | 0.9 | 0.9 | — | 4.5 | 5.5 |
| Peel strength after environmental test | 1000 hours | 6 | — | — | — | >10 to 1.0 There is dispersion of values | >10 to 2.5 There is dispersion of values |
| | 3000 hours | 2 Yellowing of adhesive layer | — | — | — | >10 to 0.0 There is dispersion of values | >10 to 2.0 There is dispersion of values |
| Initial maximum power output (W) of module | | 14.5 | — | — | — | 14.5 | 14.7 |
| Diminution rate (%) of maximum power between before and after environmental test | 1000 hours | 0.5 | — | — | — | 0.5 Deterioration in appearance by layer separation | 0.4 Deterioration in appearance by layer separation |
| | 2000 hours | 1.0 | — | — | — | 0.6 Deterioration in appearance by layer separation | 0.5 Deterioration in appearance by layer separation |
| | 3000 hours | 4.5 | — | — | — | 4.0 Deterioration in appearance by layer separation | 4.1 Deterioration in appearance by layer separation |

TABLE 2-continued

|  | | Comparative Example 7 | Comparative Example 8 | Comparative Example 9 | Comparative Example 10 |
|---|---|---|---|---|---|
| Initial peel strength of multilayer sheet at room temperature (N/width 15 mm) | | >10 to 6.5 There is dispersion of values | >10 to 6.0 There is dispersion of values | >10 to 5.0 There is dispersion of values | >10 to 5.5 There is dispersion of values |
| Initial peel strength of multilayer sheet at 100° C. (N/width 15 mm) | | >10 to 6.0 There is dispersion of values | >10 to 5.5 There is dispersion of values | >10 to 4.8 There is dispersion of values | >10 to 5.0 There is dispersion of values |
| Moisture permeability of multilayer sheet (g/m² · 24 hours) | | 6.1 | 7.1 | 2.5 | 2.7 |
| Peel strength after environmental test | 1000 hours | >10 to 4.5 There is dispersion of values | >10 to 4.0 There is dispersion of values | >10 to 3.0 There is dispersion of values | >10 to 3.5 There is dispersion of values |
| | 3000 hours | >10 to 3.7 There is dispersion of values | >10 to 3.0 There is dispersion of values | >10 to 2.0 There is dispersion of values | >10 to 2.7 There is dispersion of values |
| Initial maximum power output (W) of module | | 14.6 | 14.7 | 14.5 | 14.7 |
| Diminution rate (%) of maximum power between before and after environmental test | 1000 hours | 0.4 | 0.3 | 0.3 Deterioration in appearance by layer separation | 0.3 Deterioration in appearance by layer separation |
| | 2000 hours | 0.4 | 0.4 | 0.3 Deterioration in appearance by layer separation | 0.4 Deterioration in appearance by layer separation |
| | 3000 hours | 4.0 Deterioration in appearance by layer separation | 4.1 Deterioration in appearance by layer separation | 3.0 Deterioration in appearance by layer separation | 3.3 Deterioration in appearance by layer separation |

As shown in Table 1 above, the multilayer sheets of Examples 1 to 12, which were prepared within the scope of the present invention, were superior in the adhesiveness between layers and retained their peel strengths even under high-temperature high-humidity environment. In addition, the solar cell modules prepared by using such a multilayer sheet as the back sheet showed smaller diminution rates of maximum power when stored under high-temperature high-humidity environment. As obvious from the results above, the multilayer sheets were superior in weather resistance, heat resistance, and moisture proofness, and these properties and also the adhesiveness between the layers were preserved under high-temperature high-humidity environment, and it is apparently for this reason that water penetration into the solar cell modules was suppressed and the properties of the solar cells were favorably preserved.

The results above show that it is possible according to the present invention to obtain a multilayer sheet superior in weather resistance, heat resistance, and moisture proofness and also favorable in interlayer adhesiveness that is favorable as a back sheet for solar cells.

REFERENCE SIGNS LIST

1: Polyolefin-based resin layer
2: Polyvinylidene fluoride-based resin layer
3: Adhesion resin layer
10: Multilayer sheet
11: Solar cell module
12: Transparent substrate
13: Sealing material
14: Frame
15: Solar cell
16: Sunlight Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. A multilayer sheet, comprising:
   a first resin layer of a polyolefin-based resin composition having a melt flow rate, as determined by the method A specified in JIS K7210, of 0.5 to 25 g/10 minutes at 230° C. under a load of 2.16 kg;
   a second resin layer of a polyvinylidene fluoride-based resin composition having a melt flow rate, as determined by the method A specified in JIS K7210, of 0.5 to 25 g/10 minutes at 230° C. under a load of 2.16 kg; and
   an adhesion resin layer of a conjugated diene-based polymer, a conjugated diene-based copolymer, or the hydride thereof having a melt flow rate, as determined by the method A specified in JIS K7210, of 0.1 to 50 g/10 minutes at 230° C. under a load of 2.16 kg, wherein the first and second resin layers are laminated via the adhesion resin layer.

2. The multilayer sheet according to claim 1, wherein the adhesion resin layer is made of a homopolymer of a conjugated diene having 4 to 8 carbon atoms, a copolymer of a conjugated diene having 4 to 8 carbon atoms and other monomers, or the hydride thereof.

3. The multilayer sheet according to claim 2, wherein the adhesion resin layer is made of a copolymer of a conjugated diene having 4 to 8 carbon atoms and an aromatic vinyl compound or the hydride thereof.

4. The multilayer sheet according to claim 1, wherein the polyvinylidene fluoride-based resin composition forming the second resin layer contains 100 parts by mass of resin components (polyvinylidene fluoride: 50 to 99 mass % and polymethyl methacrylate: 1 to 50 mass %) and 1 to 40 parts by mass of a white inorganic pigment.

5. The multilayer sheet according to claim 1, wherein the first resin layer has a thickness of 50 to 500 μm and the second resin layer and the adhesion resin layer have a thickness of 5 to 50 μm.

6. The multilayer sheet according to claim 1, wherein the polyolefin-based resin composition forming the first resin layer contains, as its resin component, a homopolymer of an olefinic hydrocarbon having 2 to 20 carbon atoms or a copolymer of an olefinic hydrocarbon having 2 to 20 carbon atoms and other monomers.

7. The multilayer sheet according to claim 6, wherein the resin component of the polyolefin-based resin composition contains the unit derived from an olefinic hydrocarbon having 2 to 20 carbon atoms in an amount of 70 mass % or more.

8. The multilayer sheet according to claim 1, wherein the polyolefin-based resin composition forming the first resin layer contains a flame retardant and/or a weather-resistance improver.

9. The multilayer sheet according to claim 1, prepared by melt-coextrusion molding in a temperature range of 130 to 260° C.

10. The multilayer sheet according to claim 1, wherein the first resin layer, the adhesion resin layer, and the second resin layer separately prepared are layered in that order and laminated under pressure under a temperature condition of 130 to 260° C.

11. The multilayer sheet according to claim 1, further comprising a third resin layer containing an ethylene vinyl acetate copolymer as the resin component at least on one face.

12. A back sheet for solar cells, prepared by using the multilayer sheet according to claim 1.

13. A solar cell module, prepared by using the back sheet according to claim 12.

* * * * *